United States Patent
Kristal (10) Patent No.: US 12,225,745 B2
(45) Date of Patent: Feb. 11, 2025

(54) QUANTUM-DOT DISPLAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventor: Boris Kristal, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 980 days.

(21) Appl. No.: 17/280,118

(22) PCT Filed: Jul. 1, 2020

(86) PCT No.: PCT/CN2020/099726
§ 371 (c)(1),
(2) Date: Mar. 25, 2021

(87) PCT Pub. No.: WO2021/000891
PCT Pub. Date: Jan. 7, 2021

(65) Prior Publication Data
US 2022/0006032 A1 Jan. 6, 2022

(30) Foreign Application Priority Data

Jul. 3, 2019 (CN) .......................... 201910593843.X (51) Int. Cl.
*H01L 51/50* (2006.01)
*H01L 27/32* (2006.01)
(Continued)

(52) U.S. Cl.
CPC ........... *H10K 50/115* (2023.02); *H10K 50/15* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS

2007/0117109 A1* 5/2007 Rothemund ............ C12P 19/34
435/6.12
2009/0109435 A1* 4/2009 Kahen .................. C09K 11/883
313/503
(Continued)

FOREIGN PATENT DOCUMENTS

| CN | 103346154 A | 10/2013 |
| CN | 104449661 A | 3/2015 |

(Continued)

OTHER PUBLICATIONS

International Search Report and Written Opinion for Application No. PCT/CN2020/099726, dated Sep. 25, 2020, 9 Pages.
(Continued)

*Primary Examiner* — Eli D. Strah
(74) *Attorney, Agent, or Firm* — BROOKS KUSHMAN P.C.

(57) ABSTRACT

The present disclosure provides a quantum-dot display substrate, a method for preparing the same, and a display device. The quantum dot display substrate includes a first electrode, a second electrode, and a quantum-dot-emitting layer located between the first electrode and the second electrode, and the quantum-dot-emitting layer includes: a DNA single-stranded structure of a specific pattern, with quantum dots attached to the DNA single-stranded structure.

17 Claims, 4 Drawing Sheets

(51) Int. Cl.
  *H01L 51/56* (2006.01)
  *H10K 50/115* (2023.01)
  *H10K 50/15* (2023.01)
  *H10K 50/16* (2023.01)
  *H10K 50/17* (2023.01)
  *H10K 59/12* (2023.01)
  *H10K 71/00* (2023.01)

(52) U.S. Cl.
  CPC ............ *H10K 59/12* (2023.02); *H10K 71/00* (2023.02); *H10K 59/1201* (2023.02)

(56) References Cited

U.S. PATENT DOCUMENTS

| | | |
|---|---|---|
| 2014/0200681 A1 | 7/2014 | Kennedy et al. |
| 2016/0145679 A1* | 5/2016 | Yan ................. G01N 33/588 977/774 |
| 2016/0218141 A1 | 7/2016 | Cai |
| 2018/0009659 A1 | 1/2018 | Naasani |
| 2019/0276738 A1* | 9/2019 | Kim ................. C09K 11/883 |

FOREIGN PATENT DOCUMENTS

| | | |
|---|---|---|
| CN | 110311049 A | 10/2019 |
| IN | 106620725 A | 5/2017 |

OTHER PUBLICATIONS

First Office Action for Chinese Application No. 201910593843.X, dated Feb. 1, 2021, 12 Pages.

Arasu et al., "1D Fibers and 2D Patterns Made of Quantum Dot-Embedded DNA via Electrospinning and Electrohydrodynamic Jet Printing," Advanced Materials and Technologies 4, 2019: 1800280-, Wiley-VCH Verlag GmbH & Co. KGaA, Weinheim (9 Pages).

Samanta, Anirban, "DNA Conjugation and DNA Directed Self-Assembly of Quantum Dots for Nanophotonic Applications," Dissertation May 2014, Arizona State University, 274 Pages.

Sharma et al., "DNA-Tile-Directed Self-Assembly of Quantum Dots into Two-Dimensional Nanopatterns," Angewandte Chemie (International ed. in English), Jun. 20, 2008, pp. 5157-5159, vol. 47,28 (2008), doi:10.1002/anie.200801485 (3 Pages).

* cited by examiner

QUANTUM-DOT DISPLAY SUBSTRATE AND METHOD FOR PREPARING THE SAME, AND DISPLAY DEVICE

CROSS-REFERENCE TO RELATED APPLICATIONS

This application is the U.S. national phase of PCT Application No. PCT/CN2020/099726 filed on Jul. 1, 2020, which claims priority to Chinese Patent Application No. 201910593843.X filed on Jul. 3, 2019, which are incorporated herein by reference in their entireties.

TECHNICAL FIELD

The present disclosure relates to the field of quantum-dot display technology, in particular to a display substrate, a method for preparing the same, and a display device.

BACKGROUND

Current quantum-dot electroluminescence displays are self-luminous, unlike liquid crystal displays (LCDs) that require a backlight, so they have the advantages of light weight and small thinness, and the process for preparing quantum-dot electroluminescent displays is simple and low in cost. In addition, as compared with organic electroluminescent displays, quantum-dot electroluminescent displays have the advantages of low voltage driving, high luminous efficiency, excellent color purity, and wide viewing angles, and therefore have attracted attention as next-generation displays.

In the quantum-dot electroluminescence display, as for each pixel, each quantum-dot-emitting layer that realizes red (R), green (G), and blue (B) colors should be patterned to realize color display.

The related art uses a micro-contact printing process or inkjet printing to prepare the pattern of the quantum-dot-emitting layer of each pixel, which restricts the size of the pixel and limits the maximum resolution of the display obtained.

SUMMARY

In one aspect, an embodiment of the present disclosure provides a quantum dot display substrate, including a first electrode, a second electrode, and a quantum-dot-emitting layer located between the first electrode and the second electrode, and the quantum-dot-emitting layer includes: a DNA single-stranded structure of a specific pattern, with quantum dots attached to the DNA single-stranded structure.

In one example, the DNA single-stranded structure of the specific pattern includes: long single-stranded DNA molecules in a micrometer scale, with a plurality of quantum dots in different colors attached to different long single-stranded DNA molecules respectively and each individual quantum dot attached to one long single-stranded DNA molecule; and a staple DNA molecule, through which the long single-stranded DNA molecules are folded into the specific pattern.

Specifically, the staple DNA molecule is a short single-stranded DNA molecule, and a base of the staple DNA molecule is complementary to a base of a specific region of the long single-stranded DNA molecule.

In one example, the DNA single-stranded structure of the specific pattern includes a plurality of DNA tile structures, and each of the plurality of DNA tile structures includes: a plurality of first long single-stranded DNA molecules for forming a pattern scaffold of the specific pattern; a plurality of second staple DNA molecules connected to the plurality of first long single-stranded DNA molecules, with quantum dots in a same color attached to the plurality of second staple DNA molecules; a third staple DNA molecule connected to adjacent first long single-stranded DNA molecules; and a fourth staple DNA molecule connected to the plurality of first long single-stranded DNA molecules and located at an edge of the plurality of DNA tile structures.

In one example, each of the plurality of DNA tile structures is attached with quantum dots in a same color as one quantum dot unit; each of the plurality of second staple DNA molecules is a short single-stranded DNA molecule, which is an internal staple connected to a quantum dot; the third staple DNA molecule is a short single-stranded DNA molecule, which is a bridge staple for assembling the plurality of first long single-stranded DNA molecules together; the fourth staple DNA molecule is an edge staple, and is modified with nucleotide extension and truncation to form donor and acceptor DNA molecules.

In one example, adjacent DNA tile structures are connected through the fourth staple DNA molecule.

In one example, the plurality of DNA tile structures has a size ranging from 80 nm to 200 nm.

In one example, the fourth staple DNA molecule includes an acceptor DNA molecule and a donor DNA molecule, with the acceptor DNA molecule and the donor DNA molecule capable of being connected in complementary pairing; the quantum-dot-emitting layer includes quantum dot units in different colors, and each of the quantum dot units in different colors includes a first DNA tile structure and a second DNA tile structure, with an edge of the first DNA tile structure being the acceptor DNA molecule and an edge of the second DNA tile structure being the donor DNA molecule.

In one example, the quantum dot display substrate further includes: a hole injection material and a hole transport material that are located between the first electrode and the quantum-dot-emitting layer; and an electron transport layer located between the second electrode and the quantum-dot-emitting layer.

An embodiment of the present disclosure further provide a display device, including the quantum-dot display substrate as described above.

The embodiment of the present disclosure further provides a method for preparing a quantum-dot display substrate, including forming a first electrode, a second electrode, and a quantum-dot-emitting layer located between the first electrode and the second electrode on a thin-film transistor array substrate, the forming the quantum-dot-emitting layer includes: forming a DNA single-stranded structure of a specific pattern, with quantum dots attached to the DNA single-stranded structure.

In one example, the forming the DNA single-stranded structure of the specific pattern includes: attaching quantum dots in different colors to different long single-stranded DNA molecules of micrometer scale respectively; and folding the long single-stranded DNA molecules into the specific pattern by using a staple DNA molecule.

In one example, the forming the DNA single-stranded structure of the specific pattern includes forming a plurality of DNA tile structures, and the forming the plurality of DNA tile structures includes: forming a pattern scaffold of the specific pattern by using a plurality of first long single-stranded DNA molecules; attaching quantum dots in a same color to a plurality of second staple DNA molecules connected to the plurality of first long single-stranded DNA molecules, respectively; and connecting adjacent first long single-stranded DNA molecules by using a third staple DNA molecule; and forming a fourth staple DNA molecule connected to the plurality of first long single-stranded DNA molecules at an edge of the plurality of DNA tile structures.

In one example, attaching quantum dots to DNA molecules includes: assembling a single-stranded DNA molecule modified with an oligohistidine segment and a polyethylene glycol functionalized quantum dot to attach the quantum dot to the single-stranded DNA molecule through an interaction between the oligohistidine segment and the polyethylene glycol; or coating the quantum dots with octylamine modified polyacrylic acid, conjugating the quantum dots coated with polyacrylic acid onto a primer, and attaching the quantum dots onto the DNA molecules through polymerase chain reaction.

In one example, the forming the DNA single-stranded structure of the specific pattern includes: attaching a blue quantum dot, a red quantum dot, and a green quantum dot onto long single-stranded DNA molecules to form a DNA-quantum dot bioconjugate capable of emitting blue light, a DNA-quantum dot bioconjugate capable of emitting red light, and a DNA-quantum dot bioconjugate capable of emitting green light, respectively; and then folding these DNA-quantum dot bioconjugates into a desired pattern on the substrate by using a staple DNA molecule to complete a patterning of the quantum-dot-emitting layer, in which the staple DNA molecule is a short single-stranded DNA molecule.

In one example, after the forming the first electrode and before the forming the quantum-dot-emitting layer, the method further includes: forming a hole injection material and a hole transport material sequentially; and after the forming the quantum-dot-emitting layer and before the forming the second electrode, the method further includes: forming an electron transport layer.

In one example, each of the plurality of second staple DNA molecules is complementary to a specific region of each of the plurality of first long single-stranded DNA molecules to form a double-stranded DNA molecule, with quantum dots in a same color attached onto each of the plurality of second staple DNA molecules.

In one example, each of the plurality of DNA tile structures is attached with quantum dots in a same color as one quantum dot unit.

In one example, edge staples of the plurality of DNA tile structures are extended and truncated to form the specific pattern, so that adjacent DNA tile structures are gathered together in a specific order.

DETAILED DESCRIPTION

In order to make the technical problems to be solved, the technical solutions, and the advantages of the embodiments of the present disclosure, the present disclosure will be described hereinafter in conjunction with the drawings and specific examples.

The quantum-dot electroluminescence display includes a plurality of pixels for displaying images, and each pixel includes an anode, a quantum-dot-emitting layer, and a cathode. In the case where the anode and cathode provides holes and electrons to the quantum-dot-emitting layer, the holes and electrons recombine in the quantum-dot-emitting layer to form excitons, and the excitons drop to a stable bottom state and form light with a predetermined wavelength at the same time. Here, light having wavelengths corresponding to red, green, and blue may be formed according to the material properties of the quantum-dot-emitting layer.

For each pixel of the quantum-dot electroluminescence display, the quantum-dot-emitting layer can be patterned using a deposition process of micro-contact printing or a deposition process using inkjet printing (IJP).

However, the micro-contact printing method requires a relief pattern to be prepared on the master stamp before forming the quantum dot layer on the stamp for transfer, which significantly limits the minimum pixel size and therefore limits the maximum resolution of the display obtained. Similarly, the inkjet printing method is limited by droplet size and ink formulation, and requires a high-wall pixel definition layer (PDL) to prevent the ink on the substrate from overflowing and mixing with other inks before drying. All these limitations mean that the highest precision of the quantum-dot-emitting layer pattern achievable by the existing quantum-dot-emitting layer patterning method is in a range from about 15 μm to 20 μm, which is sufficient for large-size displays, but cannot satisfy the high resolution required by microdisplays for augmented reality (AR) and virtual reality (VR) applications. The existing quantum-dot-emitting layer patterning method can achieve a maximum resolution of 200 PPI, while the microdisplays for augmented reality (AR) and virtual reality (VR) applications require very high resolution because they are very close to the human eye, that is, more than 1000 PPI.

In view of the foregoing problems, the embodiments of the present disclosure provide a quantum dot display substrate, a method for preparing the same, and a display device, which can improve the resolution of the quantum-dot display device.

An embodiment of the present disclosure provides a quantum dot display substrate, including a first electrode, a second electrode, and a quantum-dot-emitting layer located between the first electrode and the second electrode, and the quantum-dot-emitting layer includes: a DNA single-stranded structure of a specific pattern, with quantum dots attached to the DNA single-stranded structure.

In this embodiment, a DNA single-stranded structure of a specific pattern is formed by DNA origami technology, quantum dots are attached to the DNA single-stranded structure to form the pattern of the quantum-dot-emitting layer. Due to the high precision of DNA origami technology, the pattern of the quantum-dot-emitting layer with high precision can be achieved, so as to form a quantum-dotdisplay substrate with extremely high resolution, in which the specific pattern is determined by the arrangement shape of the sub-pixels.

Quantum dots can be attached to DNA molecules through chemical reactions to form DNA-QD bioconjugates, and then DNA molecules can be arranged on the substrate into a desired shape through DNA origami technology. In this embodiment, the above solution is adopted, and the quantum-dot-emitting layer pattern with extremely high resolution can be formed on the display substrate, so that the resolution of the quantum-dot display substrate exceeds 1000 PPI.

In a specific embodiment, the DNA single-stranded structure of the specific pattern includes: long single-stranded DNA molecules in a micrometer scale, with a plurality of quantum dots in different colors attached to different long single-stranded DNA molecules respectively; and staple DNA molecules, through which the long single-stranded DNA molecules are folded into the specific pattern.

Figure 1:
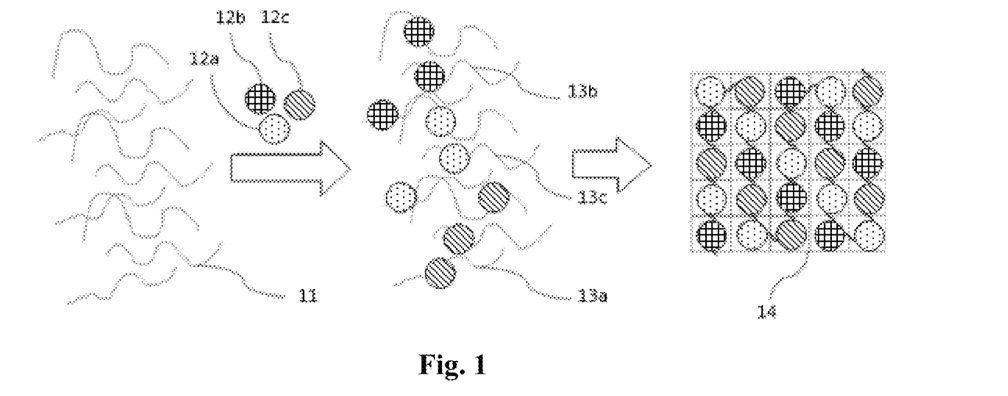
FIG. 1 is a schematic view showing the preparing a quantum-dot-emitting layer according to an embodiment of the present disclosure.

Specifically, as shown in FIG. 1, a blue quantum dot 12a, a red quantum dot 12b, and a green quantum dot 12c are attached onto long single-stranded DNA molecules 11 to form a DNA-quantum dot bioconjugate 13a capable of emitting blue light, a DNA-quantum dot bioconjugate 13b capable of emitting red light, and a DNA-quantum dot bioconjugate 13c capable of emitting green light, respectively. Then, these DNA-quantum dot bioconjugates are folded into a desired pattern 14 on the substrate by using a staple DNA molecule to complete a patterning of the quantum-dot-emitting layer. The staple DNA molecule is a short single-stranded DNA molecule. As shown in FIG. 1, a red quantum dot, a green quantum dot and a blue quantum dot are periodically arranged on the substrate, in which each quantum dot constitutes a light-emitting sub-pixel, and three sub-pixels of red, green and blue constitute a pixel.

Specifically, the blue quantum dot 12a, the red quantum dot 12b, and the green quantum dot 12c can be attached to the long single-stranded DNA molecules 11 through the following chemical reaction: assembling a single-stranded DNA molecule modified with an oligohistidine segment and a polyethylene glycol functionalized quantum dot to attach the quantum dot to the single-stranded DNA molecule through the interaction between the oligohistidine segment and the polyethylene glycol; or coating the quantum dots with octylamine modified polyacrylic acid, conjugating the quantum dots coated with polyacrylic acid onto a primer, and attaching the quantum dots onto the DNA molecules through polymerase chain reaction (PCR).

The long single-stranded DNA molecules 11 attached with quantum dots in different colors are folded into the desired shape by a plurality of staple DNA molecules, in which the base of the staple DNA molecule needs to be complementary to the base of the specific regions of the long single-stranded DNA molecule 11, thereby guiding the folding process. Since quantum dots in different colors are attached to different regions of the long single-stranded DNA molecules 11, in the case that the long single-stranded DNA molecules 11 are folded into an origami on the substrate, a pattern of quantum dots in different colors will be formed.

Exemplarily, the quantum-dot-emitting layer is formed on a substrate prepared with a thin film transistor array, a first electrode, a hole injection layer, and a hole transport layer. After the quantum-dot-emitting layer is formed, an electron transport layer, electron injection layer and a second electrode are formed to obtain a quantum-dot display substrate.

The first electrode is one of the anode and the cathode, and the second electrode is the other of the anode and the cathode.

In the technical solution of this embodiment, the quantum-dot display substrate may have extremely high resolution, and each pixel is formed by 3 sub-pixels (red sub-pixel, green sub-pixel and blue sub-pixel), in which the size of each sub-pixel is determined by the size of a single quantum dot, the width of the sub-pixel is in a range from about 10 nm to 20 nm, the length of the sub-pixel is in a range from about 10 nm to 20 nm, and the size of the pixel formed by the sub-pixels is not greater than 100 nm×20 nm.

Figure 2:
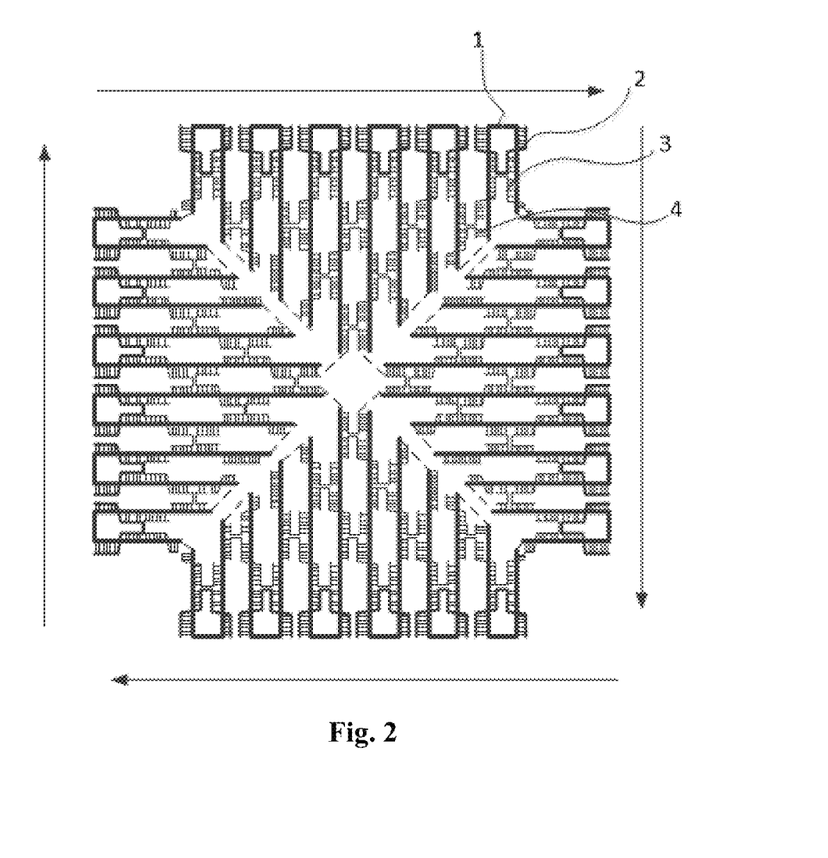
FIG. 2 is a schematic view showing a DNA tile structure according to an embodiment of the present disclosure.

In another specific embodiment, the DNA single-stranded structure of the specific pattern includes a plurality of DNA tile structures. As shown in FIG. 2, each of the plurality of DNA tile structures includes: a plurality of first long single-stranded DNA molecules 1 for forming a pattern scaffold of the specific pattern; a plurality of second staple DNA molecules 3 connected to the plurality of first long single-stranded DNA molecule 1, with quantum dots in a same color attached to the plurality of second staple DNA molecules 3; third staple DNA molecules 4 connected to adjacent first long single-stranded DNA molecules 1; and fourth staple DNA molecules 2 connected to the plurality of first long single-stranded DNA molecules 1 and located at an edge of the plurality of DNA tile structures.

Each of the plurality of DNA tile structures is attached with quantum dots in a same color as one quantum dot unit. Each of the plurality of second staple DNA molecules 3 is in a form of short single-stranded DNA molecule, which is an internal staples, and capable of being connected to the quantum dot. Each of the third staple DNA molecules 4 is in a form of a short single-stranded DNA molecule, which is a bridge staple, and capable of assembling a plurality of first long single-stranded DNA molecules 1 together. Each of the fourth staple DNA molecules 2 is an edge staple, and the adjacent DNA tile structures are connected through a fourth staple DNA molecule 2, and each of the fourth staple DNA molecules 2 is modified with nucleotide extension and truncation to form donor and acceptor DNA molecules.

Figure 3:
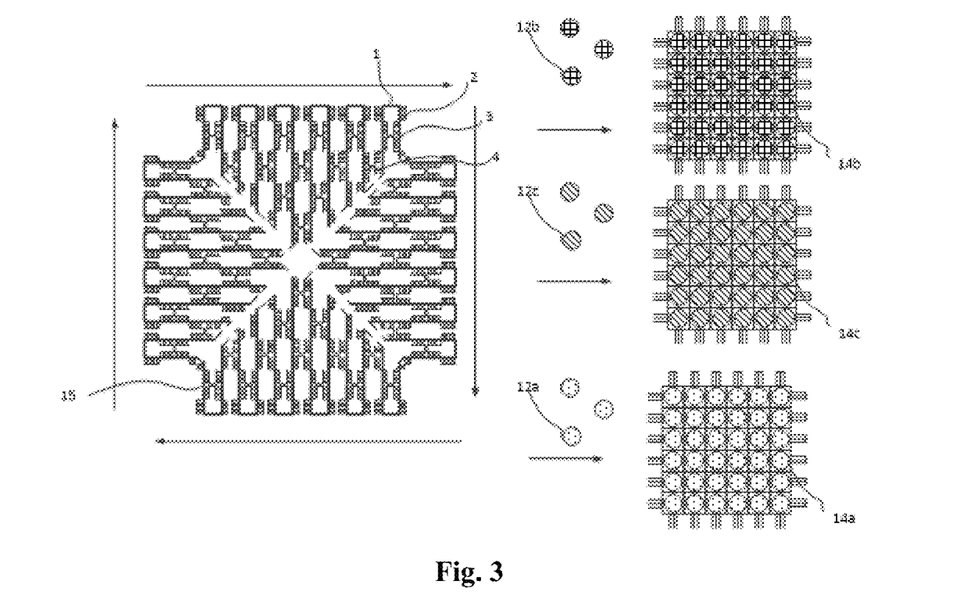
FIG. 3 is a schematic view showing the forming quantum dot units in different colors according to an embodiment of the present disclosure.

Specifically, when each quantum dot unit is prepared, as shown in FIG. 3, the first long single-stranded DNA molecule 1, the second staple DNA molecule 3, the third staple DNA molecule 4, and the fourth staple DNA molecule 2 are mixed together and annealed, to self-assemble into a DNA tile structure 15. The red quantum dot 12b, the blue quantum dot 12a and the green quantum dot 12c are attached to different DNA tile structures 15, respectively to form a red quantum dot unit 14b, a blue quantum dot unit 14a, and a green quantum dot unit 14c.

Exemplarily, when a single DNA tile structure 15 is formed, the first long single-stranded DNA molecules 1, the second staple DNA molecules 3, the third staple DNA molecules 4, and the fourth staple DNA molecules 2 can be mixed together, kept at 90° C. for 2 minutes, and annealed from 90° C. to 20° C. in a speed of 0.1° C./6 seconds. When a plurality of DNA tile structures 15 is formed, the annealing process includes a slow cooling stage and a final cooling stage. The initial annealing temperature may be in a range from 35° C. to 55° C., the end temperature of the slow cooling stage may be in a range from 25° C. to 45° C., and the end temperature of the final cooling stage may be 20° C. The difference between the end temperature of the slow cooling stage and the initial annealing temperature is 10° C., and the cooling rate of the slow cooling stage is 0.1° C./(2 to 32 minutes). The lower the end temperature of the slow cooling stage, the lower the cooling rate. The cooling rate of the final cooling stage is 0.1° C./6 seconds. In one specific example, it can be annealed from 55° C. to 45° C. in a speed of 0.1° C./2 minutes, and then annealed from 45° C. to 20° C. in a speed of 0.1° C./6 seconds.

Specifically, the blue quantum dot 12a, the red quantum dot 12b, and the green quantum dot 12c can be attached to DNA molecules through the following chemical reactions: assembling a single-stranded DNA molecule modified with an oligohistidine segment and a polyethylene glycol functionalized quantum dot to attach the quantum dot to the single-stranded DNA molecule through the interaction between the oligohistidine segment and polyethylene glycol; or coating the quantum dots with octylamine modified polyacrylic acid, conjugating the quantum dots coated with polyacrylic acid onto a primer, and attaching the quantum dots onto the DNA molecules through polymerase chain reaction (PCR).

By adjusting the number of the first long single-stranded DNA molecule 1, the size of the DNA tile structure can be adjusted. The size of the DNA tile structure can be in a range from 80 nm to 200 nm, that is, the length of the DNA tile structure can be in a range from 80 nm to 200 nm, and the width of the DNA tile structure can be in a range from 80 nm to 200 nm. When a larger size quantum dot unit is required, a plurality of DNA tile structures in the same color can be combined. When the size of the DNA tile structure is 80 nm×80 nm, each edge of the DNA tile structure has 12 DNA double helices; when the size of the DNA tile structure is 200 nm×200 nm, each edge of the DNA tile structure has 22 DNA double helices.

The edge staples of the DNA tile structure, that is, the fourth staple DNA molecules, can form a specific pattern of extension and truncation, so that adjacent DNA tile structures are gathered together in a specific order.

Each of the fourth staple DNA molecule includes an acceptor DNA molecule and a donor DNA molecule, with the acceptor DNA molecule and the donor DNA molecule capable of being connected by complementary base pairing.

The quantum-dot-emitting layer includes quantum dot units in different colors, and each of the quantum dot units in different colors includes a first DNA tile structure and a second DNA tile structure, with edges of the first DNA tile structure being the acceptor DNA molecules and edges of the second DNA tile structure being the donor DNA molecules.

Figure 4:
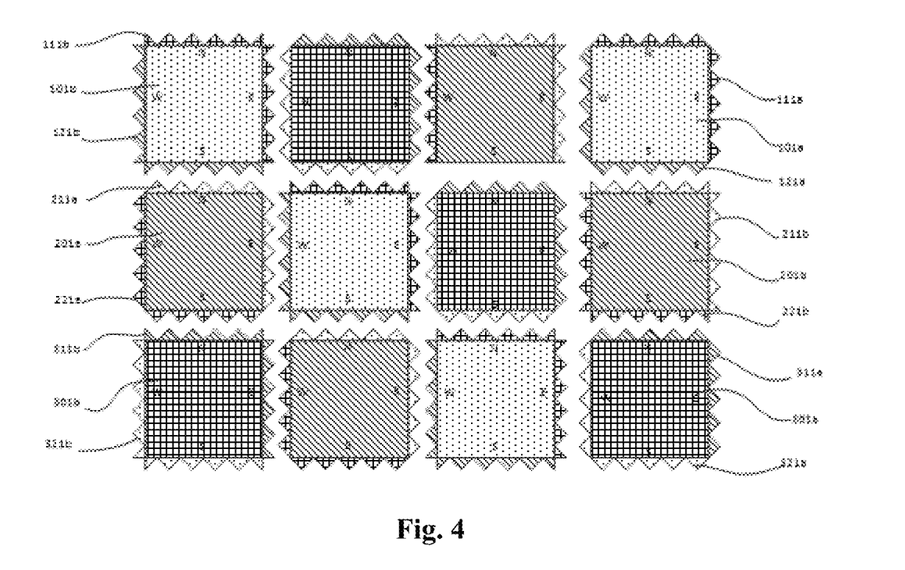
FIGS. 4 and 5 are schematic views showing the forming periodic quantum-dot-emitting layer patterns according to embodiments of the present disclosure.

In one specific embodiment, the quantum-dot display substrate includes three-color quantum dot units: a red quantum dot unit, a blue quantum dot unit, and a green quantum dot unit. In order to form periodically arranged red quantum dot unit, blue quantum dot unit, and green quantum dot unit on the substrate, the quantum dot unit of each color requires two types of DNA tile structures. As shown in FIG. 4, the red quantum dot unit includes two types of DNA tile structures, namely 301a and 301b, in which the DNA tile structure 301a has two types of fourth staple DNA molecules, namely 311a and 321a, and the DNA tile structure 301b has two types of fourth staple DNA molecules, namely 311b and 321b. The green quantum dot unit includes two types of DNA tile structures, namely 201a and 201b, in which the DNA tile structure 201a has two types of fourth staple DNA molecules, namely 211a and 221a, and the DNA tile structure 201b has two types of fourth staple DNA molecules, namely 211b and 22 1b. The blue quantum dot unit includes two types of DNA tile structures, namely 101a and 101b, in which the DNA tile structure 101a has two types of fourth staple DNA molecules, namely 111a and 121a, and the DNA tile structure 101b has two types of fourth staple DNA molecules, namely 111b and 121b. Among them, the fourth staple DNA molecule with the label suffix a can be called the acceptor DNA molecule, the fourth staple DNA molecule with the label suffix b can be called the donor DNA molecule, in which the acceptor DNA molecule can be connected to the donor DNA molecule through complementary base pairing.

Specifically, the fourth staple DNA molecule 111b of the tile structure 101b can be connected to the fourth staple DNA molecule 321a of the tile structure 301a in complementary pairing, and the fourth staple DNA molecule 121b of the tile structure 101b can be connected to the fourth staple DNA molecule 211a of the tile structure 201a in complementary pairing; the fourth staple DNA molecule 211a of the tile structure 201a can be connected to the fourth staple DNA molecule 121b of the tile structure 101b in complementary pairing, and the fourth staple DNA molecule 221a of the tile structure 201a can be connected to the fourth staple DNA molecule 311b of the tile structure 301b in complementary pairing; the fourth staple DNA molecule 311b of the tile structure 301b can be connected to the fourth staple DNA molecule 221a of the tile structure 201a in complementary pairing, and the fourth staple DNA molecule 321b of the tile structure 301b can be connected to the fourth staple DNA molecule 111a of the tile structure 101a in complementary pairing; the fourth staple DNA molecule 111a of the tile structure 101a can be connected to the fourth staple DNA molecule 321b of the tile structure 301b in complementary pairing, and the fourth staple DNA molecule 121a of the tile structure 101a can be connected to the fourth staple DNA molecule 211b of the tile structure 201b in complementary pairing; the fourth staple DNA molecule 211b of the tile structure 201b can be connected to the fourth staple DNA molecule 121a of the tile structure 101a in complementary pairing, and the fourth staple DNA molecule 221b of the tile structure 201b can be connected to the fourth staple DNA molecule 311a of the tile structure 301a in complementary pairing; and the fourth staple DNA molecule 311a of the tile structure 301a can be connected to the fourth staple DNA molecule 221b of the tile structure 201b in complementary pairing, and the fourth staple DNA molecule 321a of the tile structure 301a can be connected to the fourth staple DNA molecule 111b of the tile structure 101b in complementary pairing.

Figure 5:
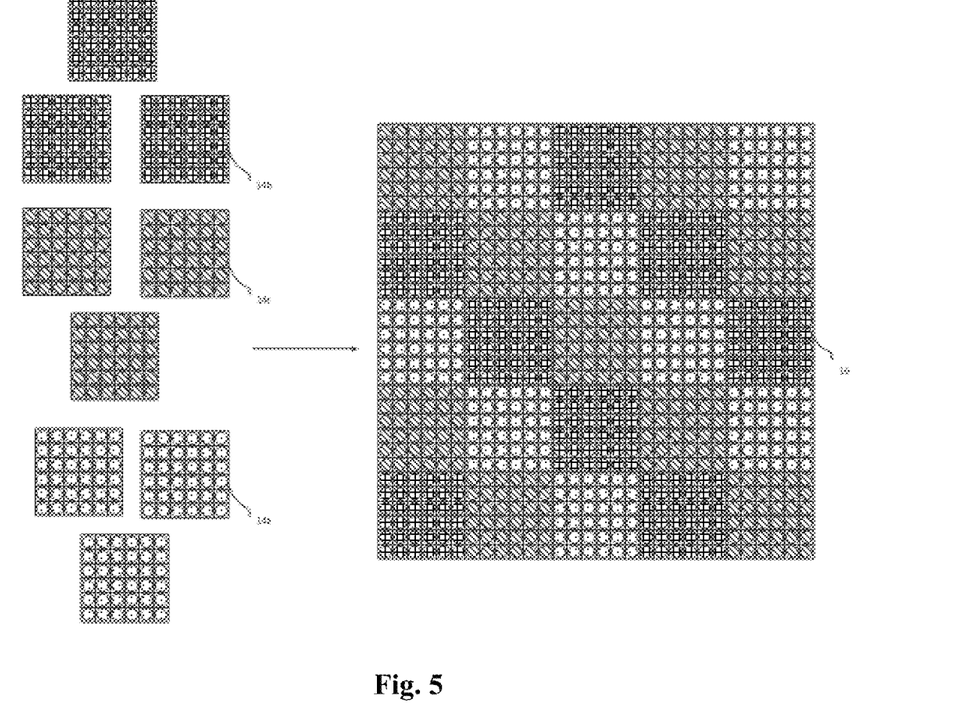

Through the complementary pairing connection of the fourth staple DNA molecules of different types and colors, as shown in FIG. 5, the quantum dot units 14a, 14b, and 14c in different colors can be arranged in a periodic pattern 16 on the surface of the substrate.

Exemplarily, the quantum-dot-emitting layer is formed on a substrate prepared with a thin film transistor array, a first electrode, a hole injection layer, and a hole transport layer. After the quantum-dot-emitting layer is formed, an electron transport layer, electron injection layer and a second electrode layer are formed to obtain a quantum-dot display substrate. The first electrode is one of the anode and the cathode, and the second electrode is the other of the anode and the cathode.

Through the technical solution of this embodiment, the resolution of the quantum dot display substrate can be improved, and the size of the sub-pixel can be controlled flexibly, in which the size of the sub-pixel can be in a range from 80 nm×80 nm to 200 nm×200 nm, or even larger (if necessary). The sub-pixel size of 80 nm×80 nm will produce a pixel size of 250 nm×100 nm, which is 2 orders of magnitude smaller than the size of sub-pixels prepared by the related technology using micro-contact printing process or inkjet printing.

As used herein, the terms "long single-stranded DNA molecule" and "short single-stranded DNA molecule" are well known in the field of DNA origami technology. Generally, "long single-stranded DNA molecule" refer to a single-stranded DNA molecule of longer than 30 nm (>100 bases) in length, and some customized single-stranded DNA molecules can be longer than 200 bases in length. In an embodiment of the present disclosure, the length of the long single-stranded DNA molecule is greater than 30 nm and less than 1000 microns.

As used herein, the term "short single-stranded DNA molecule" generally refers to a single-stranded DNA molecule of about 18 to 22 bases in length. In an embodiment of the present disclosure, the length of the short single-stranded DNA molecule is in a range from about 18 to 22 bases.

An embodiment of the present disclosure further provide a display device, including the quantum-dot display substrate as described above. The display device may be any product or component having a display function, such as a television, a display, a digital photo frame, a mobile phone, a tablet computer, etc., in which the display device further includes a flexible circuit board, a printed circuit board, and a backplane.

The display device of this embodiment can be used in VR equipment and AR equipment, and can meet the requirements of the VR equipment and AR equipment on the resolution of the display device.

The embodiment of the present disclosure further provides a method for preparing a quantum-dot display substrate, including forming a first electrode, a second electrode, and a quantum-dot-emitting layer located between the first electrode and the second electrode on a thin-film transistor array substrate, in which the forming the quantum-dot-emitting layer includes: forming a DNA single-stranded structure of a specific pattern, with quantum dots attached to the DNA single-stranded structure.

In this embodiment, a DNA single-stranded structure of a specific pattern is formed by DNA origami technology, quantum dots are attached to the DNA single-stranded structure to form the pattern of the quantum-dot-emitting layer. Due to the high precision of DNA origami technology, the pattern of the quantum-dot-emitting layer with high precision can be achieved, so as to form a quantum-dot-display substrate with extremely high resolution.

In a specific embodiment, the forming the DNA single-stranded structure of the specific pattern includes: attaching quantum dots in different colors to different long single-stranded DNA molecules of micrometer scale respectively; and folding the long single-stranded DNA molecules into the specific pattern by using a staple DNA molecule.

Specifically, as shown in FIG. 1, a blue quantum dot 12a, a red quantum dot 12b, and a green quantum dot 12c are attached onto long single-stranded DNA molecules 11, to form a DNA-quantum dot bioconjugate 13a capable of emitting blue light, a DNA-quantum dot bioconjugate 13b capable of emitting red light, and a DNA-quantum dot bioconjugate 13c capable of emitting green light, respectively. Then, these DNA-quantum dot bioconjugates are folded into a desired pattern 14 on the substrate by using staple DNA molecules, to complete a patterning of the quantum-dot-emitting layer. Each of the staple DNA molecules is a short single-stranded DNA molecule. As shown in FIG. 1, a red quantum dot, a green quantum dot and a blue quantum dot are periodically arranged on the substrate, in which each quantum dot constitutes a light-emitting sub-pixel, and three sub-pixels of red, green and blue constitute a pixel.

Specifically, the blue quantum dot 12a, the red quantum dot 12b, and the green quantum dot 12c can be attached to the long single-stranded DNA molecules 11 through the following chemical reaction: assembling a single-stranded DNA molecule modified with an oligohistidine segment and a polyethylene glycol functionalized quantum dot, to attach the quantum dot to the single-stranded DNA molecule through the interaction between the oligohistidine segment and the polyethylene glycol; or coating the quantum dots with octylamine modified polyacrylic acid, conjugating the quantum dots coated with polyacrylic acid onto a primer, and attaching the quantum dots onto the DNA molecules through polymerase chain reaction (PCR).

The long single-stranded DNA molecules 11 attached with quantum dots in different colors are folded into the target shape by a plurality of staple DNA molecules. The base of each of the plurality of staple DNA molecule need to be complementary to the base of the specific regions of the long single-stranded DNA molecules 11, thereby guiding the folding process. Since quantum dots in different colors are attached to different regions of the long single-stranded DNA molecules 11, in the case that the long single-stranded DNA molecules 11 are folded into origami on the substrate, a pattern of quantum dots in different colors will be formed.

Exemplarily, the quantum-dot-emitting layer is formed on a substrate prepared with a thin film transistor array, a first electrode, a hole injection layer, and a hole transport layer. After the quantum-dot-emitting layer is formed, an electron transport layer, electron injection layer and a second electrode are formed to obtain a quantum-dot display substrate. The first electrode is one of the anode and the cathode, and the second electrode is the other of the anode and the cathode.

In the technical solution of this embodiment, the quantum-dot display substrate may have extremely high resolution, and each pixel is formed by 3 sub-pixels (red sub-pixel, green sub-pixel and blue sub-pixel), in which the size of each sub-pixel is determined by the size of a single quantum dot, the width of the sub-pixel is in a range from about 10 nm to 20 nm, the length of the sub-pixel is in a range from about 10 nm to 20 nm, and the size of the pixel formed by the sub-pixel is not greater than 100 nm×20 nm.

In another specific embodiment, the forming the DNA single-stranded structure of the specific pattern includes forming a plurality of DNA tile structures. As shown in FIG. 2, the forming the plurality of DNA tile structures includes: forming a pattern scaffold of the specific pattern by using a plurality of first long single-stranded DNA molecules 1.

The quantum dots in the same color are respectively attached onto a plurality of second staple DNA molecules 3 connected to the plurality of first long single-stranded DNA molecules 1, in which each of the plurality of second staple DNA molecules 3 is complementary to a specific region of the plurality of first long single-stranded DNA molecules 1 to form a double-stranded DNA molecule, with quantum dots in a same color attached onto the plurality of second staple DNA molecules 3; connecting adjacent first long single-stranded DNA molecules 1 by using third staple DNA molecules 4; and forming fourth staple DNA molecules 2 connected to the plurality of first long single-stranded DNA molecules 1 at edges of the plurality of DNA tile structures.

Each of the plurality of DNA tile structures is attached with quantum dots in a same color as one quantum dot unit.

Each of the plurality of second staple DNA molecules 3 is a short single-stranded DNA molecule, which is an internal staple, and capable of being connected to quantum dots; each of the third staple DNA molecules 4 is a short single-stranded DNA molecule, which is a bridge staple, and capable of assembling the plurality of first long single-stranded DNA molecules 1 together; and each of the fourth staple DNA molecules 2 is an edge staple, in which the adjacent DNA tile structures are connected through the fourth staple DNA molecules 2, and each of the fourth staple DNA molecules 2 is modified with nucleotide extension and truncation to form donor and acceptor DNA molecules.

Specifically, when each quantum dot unit is prepared, as shown in FIG. 3, the first long single-stranded DNA molecules 1, the second staple DNA molecules 3, the third staple DNA molecules 4, and the fourth staple DNA molecules 2 are mixed together and annealed, to self-assemble into a DNA tile structure 15. The red quantum dots 12b, the blue quantum dots 12a and the green quantum dots 12c are attached to different DNA tile structures 15, respectively to form a red quantum dot unit 14b, a blue quantum dot unit 14a, and a green quantum dot unit 14c.

Exemplarily, when a single DNA tile structure 15 is formed, the first long single-stranded DNA molecules 1, the second staple DNA molecules 3, the third staple DNA molecules 4, and the fourth staple DNA molecules 2 can be mixed together, kept at 90° C. for 2 minutes, and annealed from 90° C. to 20° C. in a speed of 0.1° C./6 seconds. When a plurality of DNA tile structures 15 is formed, the annealing process includes a slow cooling stage and a final cooling stage. The initial annealing temperature may be in a range from 35° C. to 55° C., the end temperature of the slow cooling stage may be in a range from 25° C. to 45° C., and the end temperature of the final cooling stage may be 20° C. The difference between the end temperature of the slow cooling stage and the initial annealing temperature is 10° C., and the cooling rate of the slow cooling stage is 0.1° C./(2 to 32 minutes). The lower the end temperature of the slow cooling stage, the lower the cooling rate. The cooling rate of the final cooling stage is 0.1° C./6 seconds. In one specific example, it can be annealed from 55° C. to 45° C. in a speed of 0.1° C./2 minutes, and then annealed from 45° C. to 20° C. in a speed of 0.1° C./6 seconds.

Specifically, the blue quantum dot 12a, the red quantum dot 12b, and the green quantum dot 12c can be attached to DNA molecules through the following chemical reactions: assembling a single-stranded DNA molecule modified with an oligohistidine segment and a polyethylene glycol functionalized quantum dot to attach the quantum dot to the single-stranded DNA molecule through the interaction between the oligohistidine segment and the polyethylene glycol; or coating the quantum dots with octylamine modified polyacrylic acid, conjugating the quantum dots coated with polyacrylic acid onto a primer, and attaching the quantum dots onto the DNA molecules through polymerase chain reaction.

By adjusting the number of the first long single-stranded DNA molecules 1, the size of the DNA tile structure can be adjusted. The size of the DNA tile structure can be in a range from 80 nm to 200 nm, that is, the length of the DNA tile structure can be in a range from 80 nm to 200 nm, and the width of the DNA tile structure can be in a range from 80 nm to 200 nm. When a larger size quantum dot unit is required, a plurality of DNA tile structures in the same color can be combined. When the size of the DNA tile structure is 80 nm×80 nm, each edge of the DNA tile structure has 12 DNA double helices; when the size of the DNA tile structure is 200 nm×200 nm, each edge of the DNA tile structure has 22 DNA double helices.

The edge staples of the DNA tile structure, that is, the fourth staple DNA molecules, can form a specific pattern of extension and truncation, so that adjacent DNA tile structures are gathered together in a specific order.

Each of the fourth staple DNA molecule includes an acceptor DNA molecule and a donor DNA molecule, with the acceptor DNA molecule and the donor DNA molecule capable of being connected in complementary pairing.

The quantum-dot-emitting layer includes quantum dot units in different colors, and each of the quantum dot units in different colors includes a first DNA tile structure and a second DNA tile structure, with an edge of the first DNA tile structure being the acceptor DNA molecule and an edge of the second DNA tile structure being the donor DNA molecule.

In one specific embodiment, the quantum-dot display substrate includes three-color quantum dot units: a red quantum dot unit, a blue quantum dot unit, and a green quantum dot unit. In order to form periodically arranged red quantum dot units, blue quantum dot units and green quantum dot units on the substrate, the quantum dot unit of each color requires two types of DNA tile structures. As shown in FIG. 4, the red quantum dot unit includes two types of DNA tile structures, namely 301a and 301b, in which the DNA tile structure 301a has two types of fourth staple DNA molecules, namely 311a and 321a, and the DNA tile structure 301b has two types of fourth staple DNA molecules, namely 311b and 321b. The green quantum dot unit includes two types of DNA tile structures, namely 201a and 201b, in which the DNA tile structure 201a has two types of fourth staple DNA molecules, namely 211a and 221a, and the DNA tile structure 201b has two types of fourth staple DNA molecules, namely 211b and 221b. The blue quantum dot unit includes two types of DNA tile structures, namely 101a and 101b, in which the DNA tile structure 101a has two types of fourth staple DNA molecules, namely 111a and 121a, and the DNA tile structure 101b has two types of fourth staple DNA molecules, namely 111b and 121b. Among them, the fourth staple DNA molecule with the label suffix a can be called the acceptor DNA molecule, the fourth staple DNA molecule with the label suffix b can be called the donor DNA molecule, in which the acceptor DNA molecule can be connected to the donor DNA molecule in complementary pairing.

Specifically, the fourth staple DNA molecule 111b of the tile structure 101b can be connected to the fourth staple DNA molecule 321a of the tile structure 301a in complementary pairing, and the fourth staple DNA molecule 121b of the tile structure 101b can be connected to the fourth staple DNA molecule 211a of the tile structure 201a in complementary pairing; the fourth staple DNA molecule 211a of the tile structure 201a can be connected to the fourth staple DNA molecule 121b of the tile structure 101b in complementary pairing, and the fourth staple DNA molecule 221a of the tile structure 201a can be connected to the fourth staple DNA molecule 311b of the tile structure 301b in complementary pairing; the fourth staple DNA molecule 311b of the tile structure 301b can be connected to the fourth staple DNA molecule 221a of the tile structure 201a in complementary pairing, and the fourth staple DNA molecule 321b of the tile structure 301b can be connected to the fourth staple DNA molecule 111a of the tile structure 101a in complementary pairing; the fourth staple DNA molecule 111a of the tile structure 101a can be connected to the fourth staple DNA molecule 321b of the tile structure 301b in complementary pairing, and the fourth staple DNA molecule 121a of the tile structure 101a can be connected to the fourth staple DNA molecule 211b of the tile structure 201b in complementary pairing; the fourth staple DNA molecule 211b of the tile structure 201b can be connected to the fourth staple DNA molecule 121a of the tile structure 101a in complementary pairing, and the fourth staple DNA molecule 221b of the tile structure 201b can be connected to the fourth staple DNA molecule 311a of the tile structure 301a in complementary pairing; and the fourth staple DNA molecule 311a of the tile structure 301a can be connected to the fourth staple DNA molecule 221b of the tile structure 201b in complementary pairing, and the fourth staple DNA molecule 321a of the tile structure 301a can be connected to the fourth staple DNA molecule 111b of the tile structure 101b in complementary pairing.

Through the complementary pairing connection of the fourth staple DNA molecules of different types and colors, as shown in FIG. 5, the quantum dot units 14a, 14b, and 14c in different colors can be arranged in a periodic pattern 16 on the surface of the substrate.

Exemplarily, the quantum-dot-emitting layer is formed on a substrate prepared with a thin film transistor array, a first electrode, a hole injection layer, and a hole transport layer. After the quantum-dot-emitting layer is formed, an electron transport layer, an electron injection layer and a second electrode are formed, to obtain a quantum-dot display substrate. The first electrode is one of the anode and the cathode, and the second electrode is the other of the anode and the cathode.

Through the technical solution of this embodiment, the resolution of the quantum dot display substrate can be improved, and the size of the sub-pixel can be controlled flexibly, in which the size of the sub-pixel can be in a range from 80 nm×80 nm to 200 nm×200 nm, or even larger (if necessary). The sub-pixel size of 80 nm×80 nm will produce a pixel size of 250 nm×100 nm, which is 2 orders of magnitude smaller than the size of sub-pixels prepared by the related technology using micro-contact printing process or inkjet printing.

Figure 6:
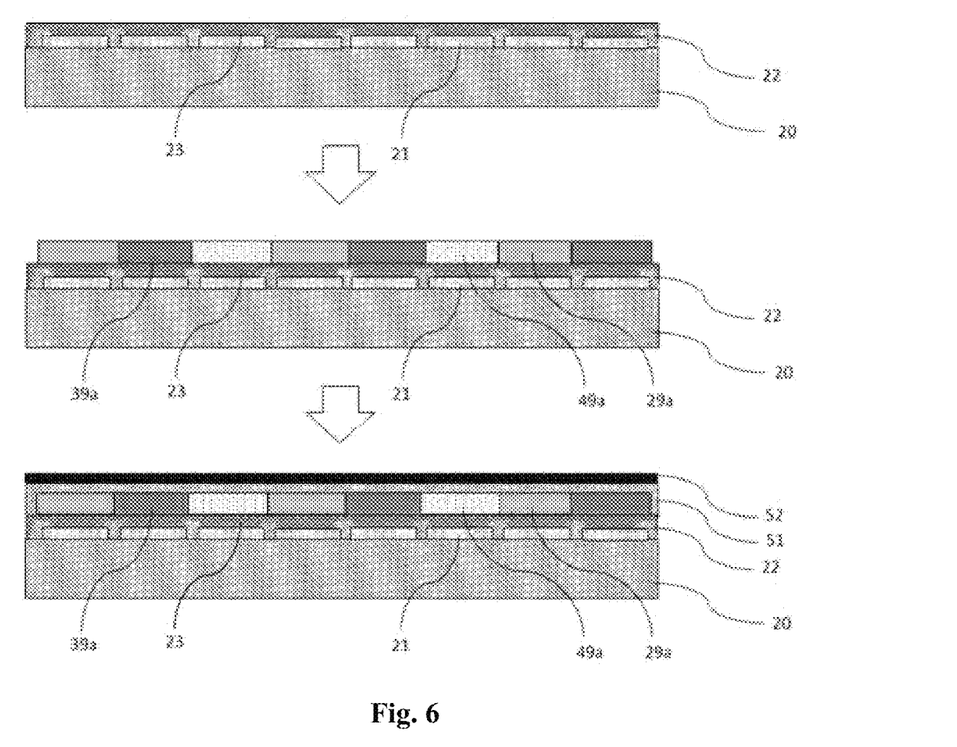
FIG. 6 is a schematic view showing a manufacturing process of a quantum-dot display substrate according to an embodiment of the present disclosure.

In one specific embodiment, as shown in FIG. 6, the method for preparing the quantum dot display substrate of this embodiment includes the following steps.

Step 1. A substrate 20 is provided, in which a thin-film transistor array layer is formed on the substrate 20, and a first electrode 21, a pixel definition layer 22 and a first common layer 23 are formed on the substrate 20.

Exemplarily, the base substrate of the substrate 20 may be made of glass, metal foil or transparent polymer, and the transparent polymer may be made of at least one of the following: polyester, polyacrylic acid, polyethylene oxide, polyethylene, polystyrene. The first electrode 21 is specifically an anode, which can be made of a transparent conductive material, in which the transparent conductive material can be indium tin oxide (ITO) or indium zinc oxide (IZO).

The pixel definition layer 22 can be made of organic materials or inorganic materials, in which the organic materials can be polyimide or other photoresist materials, and the inorganic materials can be silicon nitride, silicon oxide or similar materials. The first common layer 23 may be a hole injection material, a hole transport material, and an electron blocking material deposited by thermal deposition, spin coating, inkjet printing, or other methods.

Step 2. Through the method for preparing the quantum dot unit of the present disclosure, the blue quantum dot unit 49a, the red quantum dot unit 29a and the green quantum dot unit 39a are formed on the substrate subjected to step 1, in which the blue quantum dot unit 49a, the red quantum dot unit 29a and the green quantum dot unit 39a are alternately arranged.

Step 3. A second common layer 51 and a second electrode 52 are formed on the substrate after step 2.

Exemplarily, the second common layer 51 may be an electron transport layer and an electron injection layer deposited by thermal deposition, spin coating, inkjet printing or other methods; and the second electrode 52 is specifically a cathode, which may be made of a metal, such as Ag.

After the above steps, the quantum-dot display substrate of this embodiment can be obtained. The quantum dot display substrate of this embodiment has a higher resolution and can be used in AR devices and VR devices.

Embodiments of the present disclosure have the following advantageous effects.

In the above scheme, a DNA single-stranded structure of a specific pattern is formed by DNA origami technology, quantum dots are attached to the DNA single-stranded structure to form the pattern of the quantum-dot-emitting layer. Due to the high precision of DNA origami technology, the pattern of the quantum-dot-emitting layer with high precision can be achieved, so as to form a quantum-dot-display substrate with extremely high resolution.

Unless otherwise defined, technical terms or scientific terms used herein have the normal meaning commonly understood by one skilled in the art of the present disclosure. The words "first", "second", and the like used herein do not denote any order, quantity, or importance, but rather merely serve to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above description are optional embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A quantum dot display substrate, comprising a first electrode, a second electrode, and a quantum-dot-emitting layer located between the first electrode and the second electrode, wherein the quantum-dot-emitting layer comprises: a DNA single-stranded structure of a specific pattern, with quantum dots attached to the DNA single-stranded structure,
   wherein the DNA single-stranded structure of the specific pattern comprises:
   long single-stranded DNA molecules having a length of greater than 30 nm and less than 1000 microns, with a plurality of quantum dots in different colors attached to different long single-stranded DNA molecules respectively; and a staple DNA molecule, through which the long single-stranded DNA molecules are folded into the specific pattern, wherein the DNA single-stranded structure of the specific pattern comprises a plurality of DNA tile structures, and each of the plurality of DNA tile structures comprises:

a plurality of first long single-stranded DNA molecules for forming a pattern scaffold of the specific pattern;

a plurality of second staple DNA molecules connected to the plurality of first long single-stranded DNA molecules, with quantum dots in a same color attached to the plurality of second staple DNA molecules;

a third staple DNA molecule connected to adjacent first long single-stranded DNA molecules; and a fourth staple DNA molecule connected to the plurality of first long single-stranded DNA molecules and located at an edge of the plurality of DNA tile structures, wherein each of the plurality of DNA tile structures is attached with quantum dots in a same color as one quantum dot unit, each of the plurality of second staple DNA molecules is a short single-stranded DNA molecule having a length of 18 to 22 bases, which is an internal staple connected to a quantum dot; the third staple DNA molecule is a short single-stranded DNA molecule having a length of 18 to 22 bases, which is a bridge staple for assembling the plurality of first long single-stranded DNA molecules together; the fourth staple DNA molecule is an edge staple modified with nucleotide extension and truncation to form donor and acceptor DNA molecules.

2. The quantum-dot display substrate of claim 1, wherein the staple DNA molecule is a short single-stranded DNA molecule having a length of 18 to 22 bases, and a base of the staple DNA molecule is complementary to a base of a specific region of the long single-stranded DNA molecule.

3. The quantum-dot display substrate of claim 1, wherein adjacent DNA tile structures are connected through the fourth staple DNA molecule.

4. The quantum-dot display substrate of claim 1, wherein the plurality of DNA tile structures has a size ranging from 80 nm to 200 nm.

5. The quantum-dot display substrate of claim 3, wherein the fourth staple DNA molecule comprises an acceptor DNA molecule and a donor DNA molecule, with the acceptor DNA molecule and the donor DNA molecule capable of being connected in complementary pairing;

the quantum-dot-emitting layer comprises quantum dot units in different colors, and each of the quantum dot units in different colors comprises a first DNA tile structure and a second DNA tile structure, with an edge of the first DNA tile structure being the acceptor DNA molecule and an edge of the second DNA tile structure being the donor DNA molecule.

6. The quantum-dot display substrate of claim 1, further comprising:

a hole injection material and a hole transport material that are located between the first electrode and the quantum-dot-emitting layer; and an electron transport layer located between the second electrode and the quantum-dot-emitting layer.

7. A display device, comprising the quantum-dot display substrate of claim 1.

8. A method for preparing a quantum-dot display substrate, comprising forming a first electrode, a second electrode, and a quantum-dot-emitting layer located between the first electrode and the second electrode on a thin-film transistor array substrate, wherein the forming the quantum-dot-emitting layer comprises: forming a DNA single-stranded structure of a specific pattern, with quantum dots attached to the DNA single-stranded structure, wherein the DNA single-stranded structure of the specific pattern comprises:

long single-stranded DNA molecules having a length of greater than 30 nm and less than 1000 microns, with a plurality of quantum dots in different colors attached to different long single-stranded DNA molecules respectively; and a staple DNA molecule, through which the long single-stranded DNA molecules are folded into the specific pattern, wherein the DNA single-stranded structure of the specific pattern comprises a plurality of DNA tile structures, and each of the plurality of DNA tile structures comprises:

a plurality of first long single-stranded DNA molecules for forming a pattern scaffold of the specific pattern;

a plurality of second staple DNA molecules connected to the plurality of first long single-stranded DNA molecules, with quantum dots in a same color attached to the plurality of second staple DNA molecules;

a third staple DNA molecule connected to adjacent first long single-stranded DNA molecules; and a fourth staple DNA molecule connected to the plurality of first long single-stranded DNA molecules and located at an edge of the plurality of DNA tile structures, wherein each of the plurality of DNA tile structures is attached with quantum dots in a same color as one quantum dot unit, each of the plurality of second staple DNA molecules is a short single-stranded DNA molecule having a length of 18 to 22 bases, which is an internal staple connected to a quantum dot; the third staple DNA molecule is a short single-stranded DNA molecule having a length of 18 to 22 bases, which is a bridge staple for assembling the plurality of first long single-stranded DNA molecules together; the fourth staple DNA molecule is an edge staple modified with nucleotide extension and truncation to form donor and acceptor DNA molecules.

9. The method of claim 8, wherein the forming the DNA single-stranded structure of the specific pattern comprises:

attaching quantum dots in different colors to different long single-stranded DNA molecules of micrometer scale respectively; and folding the long single-stranded DNA molecules into the specific pattern by using a staple DNA molecule.

10. The method of claim 8, wherein the forming the DNA single-stranded structure of the specific pattern comprises forming a plurality of DNA tile structures, and the forming the plurality of DNA tile structure comprises:

forming a pattern scaffold of the specific pattern by using a plurality of first long single-stranded DNA molecules;

attaching quantum dots in a same color to a plurality of second staple DNA molecules connected to the plurality of first long single-stranded DNA molecules, respectively; and connecting adjacent first long single-stranded DNA molecules by using a third staple DNA molecule; and forming a fourth staple DNA molecule connected to the plurality of first long single-stranded DNA molecules at an edge of the plurality of DNA tile structures.

11. The method of claim 10, wherein the attaching quantum dots in the same color to the plurality of second staple DNA molecules comprises:
assembling a single-stranded DNA molecule modified with an oligohistidine segment and a polyethylene glycol functionalized quantum dot to attach the quantum dot to the single-stranded DNA molecule through an interaction between the oligohistidine segment and the polyethylene glycol.

12. The method of claim 10, wherein the attaching quantum dots in the same color to the plurality of second staple DNA molecules comprises: coating the quantum dots with octylamine modified polyacrylic acid, conjugating the quantum dots coated with polyacrylic acid onto a primer, and attaching the quantum dots onto the DNA molecules through polymerase chain reaction.

13. The method of claim 8, wherein the forming the DNA single-stranded structure of the specific pattern comprises: attaching a blue quantum dot, a red quantum dot, and a green quantum dot onto long single-stranded DNA molecules to form a DNA-quantum dot bioconjugate capable of emitting blue light, a DNA-quantum dot bioconjugate capable of emitting red light, and a DNA-quantum dot bioconjugate capable of emitting green light, respectively; and then folding these DNA-quantum dot bioconjugates into a desired pattern on the substrate by using a staple DNA molecule to complete a patterning of the quantum-dot-emitting layer, wherein the staple DNA molecule is a short single-stranded DNA molecule having a length of 18 to 22 bases.

14. The method of claim 8, wherein after the forming the first electrode and before the forming the quantum-dot-emitting layer, the method further comprises:
forming a hole injection material and a hole transport material sequentially; and
after the forming the quantum-dot-emitting layer and before the forming the second electrode, the method further comprises:
forming an electron transport layer.

15. The method of claim 10, wherein each of the plurality of second staple DNA molecules is complementary to a specific region of each of the plurality of first long single-stranded DNA molecules to form a double-stranded DNA molecule, with quantum dots in a same color attached onto each of the plurality of second staple DNA molecules.

16. The method of claim 10, wherein each of the plurality of DNA tile structures is attached with quantum dots in a same color as one quantum dot unit.

17. The method of claim 10, wherein edge staples of the plurality of DNA tile structures are extended and truncated to form the specific pattern, so that adjacent DNA tile structures are gathered together in a specific order.

* * * * *